United States Patent
Zhu et al.

(10) Patent No.: US 8,383,444 B2
(45) Date of Patent: Feb. 26, 2013

(54) METHOD FOR DETERMINING COLOR USING CMOS IMAGE SENSOR

(75) Inventors: Hong Zhu, Shanghai (CN); Jim Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 249 days.

(21) Appl. No.: 12/953,410

(22) Filed: Nov. 23, 2010

(65) Prior Publication Data

US 2011/0149085 A1 Jun. 23, 2011

Related U.S. Application Data

(62) Division of application No. 12/136,568, filed on Jun. 10, 2008, now Pat. No. 7,868,367.

(30) Foreign Application Priority Data

Dec. 13, 2007 (CN) .......................... 2007 1 0094550

(51) Int. Cl.
*H01L 21/00* (2006.01)
(52) U.S. Cl. ............... 438/59; 438/57; 438/60; 438/70; 438/73; 438/75; 257/292; 257/294; 257/E21.632; 257/E33.045; 257/E33.076; 250/208.1; 250/214.1; 348/189; 348/E17.004
(58) Field of Classification Search .................. None
See application file for complete search history.

(56) References Cited

U.S. PATENT DOCUMENTS

| | | |
|---|---|---|
| 3,378,688 A | 4/1968 | Kabell |
| 3,971,065 A | 7/1976 | Bayer |
| 3,996,536 A | 12/1976 | Camisa |
| 4,021,844 A | 5/1977 | Gilles et al. |
| 4,672,015 A | 6/1987 | Maruyama et al. |
| 4,758,734 A | 7/1988 | Uchida et al. |
| 5,625,210 A | 4/1997 | Lee et al. |
| 5,903,021 A | 5/1999 | Lee et al. |

(Continued)

FOREIGN PATENT DOCUMENTS

| CN | 1828947 A | 9/2006 |
|---|---|---|
| CN | 1889269 A | 1/2007 |

(Continued)

OTHER PUBLICATIONS

*Ex Parte* Quayle Action for U.S. Appl. No. 12/136,568, mailed on Mar. 4, 2010, 7 pages.

(Continued)

*Primary Examiner* — Zandra Smith
*Assistant Examiner* — Khanh Duong
(74) *Attorney, Agent, or Firm* — Kilpatrick Townsend & Stockton LLP

(57) ABSTRACT

A method is provided for determining a color using a CMOS image sensor. The CMOS image sensor includes an n-type substrate and a p-type epitaxy layer overlying the n-type substrate. The method includes applying a first voltage on the n-type substrate and obtaining a first output, which is associated with the first voltage. The method further includes applying a second voltage on the n-type substrate and obtaining a second output, which is associated with the second voltage. The method additionally includes applying a third voltage on the n-type substrate and obtaining a third output, which is associated with the third voltage. The method also includes providing a plurality of weighting factors and determining the color based on the plurality of weighting factors, the first output, the second output, and the third output.

10 Claims, 11 Drawing Sheets

U.S. PATENT DOCUMENTS

| | | | |
|---|---|---|---|
| 5,965,857 | A | 10/1999 | Hughes |
| 6,291,859 | B1 | 9/2001 | Litwin et al. |
| 6,534,759 | B1 | 3/2003 | Koscielniak et al. |
| 6,841,816 | B2 | 1/2005 | Merrill et al. |
| 6,852,262 | B2 | 2/2005 | Hopper et al. |
| 6,858,912 | B2 | 2/2005 | Marshall et al. |
| 6,876,049 | B2 | 4/2005 | Fan et al. |
| 6,891,869 | B2 | 5/2005 | Augusto |
| 6,894,265 | B2 | 5/2005 | Merrill et al. |
| 6,914,314 | B2 | 7/2005 | Merrill et al. |
| 6,956,273 | B2 | 10/2005 | Koizumi |
| 7,166,880 | B2 | 1/2007 | Merrill et al. |
| 7,180,150 | B2 * | 2/2007 | Min ............................... 257/440 |
| 7,419,844 | B2 | 9/2008 | Lee et al. |
| 7,423,305 | B2 | 9/2008 | Shinohara et al. |
| 7,449,712 | B2 | 11/2008 | Cha |
| 7,567,646 | B2 | 7/2009 | Buchinsky |
| 7,605,354 | B2 | 10/2009 | Koyama |
| 7,633,104 | B2 | 12/2009 | Lim |
| 7,651,883 | B2 | 1/2010 | Lee et al. |
| 7,652,313 | B2 | 1/2010 | Ellis |
| 7,655,493 | B2 | 2/2010 | Wen et al. |
| 7,696,596 | B2 | 4/2010 | Lim |
| 7,704,776 | B2 | 4/2010 | Park |
| 7,732,246 | B2 | 6/2010 | Lee |
| 7,868,367 | B2 | 1/2011 | Hong et al. |
| 7,955,924 | B2 * | 6/2011 | Song et al. .................... 438/228 |
| 2004/0094783 | A1 | 5/2004 | Hong |
| 2004/0133863 | A1 | 7/2004 | Dai et al. |
| 2006/0001752 | A1 | 1/2006 | Yanagisawa et al. |
| 2007/0063299 | A1 | 3/2007 | Hwang |
| 2007/0158659 | A1 | 7/2007 | Bensce |
| 2007/0187793 | A1 | 8/2007 | Moon et al. |
| 2007/0218578 | A1 | 9/2007 | Lee et al. |
| 2007/0218579 | A1 | 9/2007 | Lee et al. |
| 2007/0218580 | A1 | 9/2007 | Hsu et al. |
| 2007/0246756 | A1 | 10/2007 | Mouli |
| 2007/0278544 | A1 | 12/2007 | Shinohara |
| 2008/0099868 | A1 | 5/2008 | Sekiguchi |
| 2008/0149976 | A1 | 6/2008 | Lim |
| 2008/0157139 | A1 | 7/2008 | Lee |
| 2008/0157247 | A1 | 7/2008 | Yun |
| 2008/0170228 | A1 | 7/2008 | Jiang |
| 2008/0296475 | A1 | 12/2008 | Kim |
| 2008/0303072 | A1 | 12/2008 | Lee et al. |
| 2009/0045346 | A1 | 2/2009 | Von Kanel et al. |
| 2009/0309008 | A1 | 12/2009 | Lee |
| 2010/0194955 | A1 | 8/2010 | Lee |

FOREIGN PATENT DOCUMENTS

| | | |
|---|---|---|
| KR | 2007278181 | 7/2006 |

OTHER PUBLICATIONS

Non-Final Office Action for U.S. Appl. No. 12/136,568, mailed on Aug. 28, 2009, 9 pages.

Notice of Allowance for U.S. Appl. No. 12/136,568, mailed on Jun. 11, 2010, 7 pages.

Notice of Allowance for U.S. Appl. No. 12/136,568, mailed on Aug. 23, 2010, 7 pages.

Notice of Allowance for U.S. Appl. No. 12/953,417, mailed on Apr. 26, 2011, 10 pages.

Office Action of Chinese Application No. 200710094550.4 dated Oct. 9, 2009, 7 pages total (English translation not included).

Requirement for Restriction/Election for U.S. Appl. No. 12/136,568, mailed on Jun. 1, 2009, 7 pages.

Notice of Allowance for U.S. Appl. No. 12/953,417, mailed on May 31, 2011, 10 pages.

Notice of Allowance for U.S. Appl. No. 12/953,414; mailed Nov. 28, 2012, 8 pages.

* cited by examiner (Bayer Mask)

METHOD FOR DETERMINING COLOR USING CMOS IMAGE SENSOR

CROSS-REFERENCES TO RELATED APPLICATIONS

This application is a division of U.S. patent application Ser. No. 12/136,568, entitled "System and Method for Sensing Image on CMOS," filed on Jun. 18, 2008, which claims priority to Chinese Patent Application No. 200710094550.4, filed Dec. 13, 2007 (SMIC Docket No. 2004-00298-SH-US), commonly assigned and hereby incorporated by reference for all purposes.

BACKGROUND OF THE INVENTION

This invention is directed to imaging techniques. More particularly, the invention provides a method and system for capturing images on CMOS color sensors. Merely by way of example, the invention has been used to capture true color information on each pixel of an N-type substrate CMOS sensor. But it would be recognized that the invention has a much broader range of applicability.

To capture vivid imageries have been long been an endeavor that persisted as long as the human race itself. As early as the Stone Age, people tried to capture of what they see with cave drawings. Over the thousands of years, artists developed techniques for capture images with paint brushes and canvases. With oil paintings, artists have been able to capture real world images with accuracy, but the fidelity of paintings is no match to photography.

In 1826, a French inventor Nicéphore Niépce produced the first photographic image on polished pewter plate covered with a petroleum derivative. Since then, the technique for photographic imaging has been evolved. Better techniques and equipment have improved image quality over the next hundred of years. Over the last fifty years, techniques for color photography have been improved and consummated. In the last decade, with the introduction of the first commercially available digital camera by Kodak in 1990, a new type of image capturing technique, digital imaging, has rapidly become a popular way for capturing images.

For digital imaging, the image sensor (or digital equivalent of film negatives) is one of the most important components for digital imaging devices, such as digital cameras, camera phones, etc. For a long time, image sensors have been based on charge-coupled device (CCD) technology that has been developed by George Smith and Willard Boyle at Bell Labs. In the past, imaging devices have been predominantly CCD based. Recently, CMOS image sensors have become more popular.

The CMOS image sensor technology typically includes millions of sensor pixels (light sensing units), each of the sensor pixel includes two to four transistors and a photodiode. Typically, conventional techniques for CMOS image sensing use one np junction, with very shallow p+ layer applied on top of the N-type region to reduce noise and to enhance the blue color response in image capturing process. In a way, a CMOS sensor unit works in a similar manner as a capacitor. The more charge stored in the electrode, the higher the voltage drop across the depletion region of the CMOS. Light, which is an energy source, generates free carriers. The free carriers under an electric field run towards the N-type region of the CMOS sensor and neutralize the charge and reduce the voltage potential. The voltage difference before and after the integration of energy provides a signal level. The signal level is then used as a reading for the amount of light being detected and used for forming an image.

Depending upon applications, CMOS sensors often have advantages over CCD sensors. For example, compared to CCD image sensors, CMOS image sensors usually provide lower costs and longer battery life. As a result, CMOS image sensors are preferably used in portable imaging devices such as camera phones and point and shoot cameras. At the high end, CCD image sensors are often behind CMOS images sensors in terms of noise level and sensitivity. Because of the many advantages of CMOS image sensors, more resources have been invested in the development of technologies for CMOS image sensors. The resolution of CMOS image sensor has been increased as pixel size shrinks with the MOS transistor channel length. While the increased resolution of image sensors often provides a higher image resolution, the decreased pixel size and the associated increase in noise level have degraded image quality. Various techniques, such as improvements on structure and circuitry, have been developed to improve image quality. For example, various systems and methods have been developed to provide color separation. In general, three major approaches have been used to provide color separation: color filter, stack junction photo diode, and junction separation. Unfortunately, the abovementioned techniques for image sensing and color separation are often inadequate. These and other limitations of the conventional techniques have been overcome by the present invention.

Therefore, it is desirable to have an improved method and system for a CMOS image sensing device.

BRIEF SUMMARY OF THE INVENTION

The present invention is directed to imaging techniques. More particularly, embodiments of the present invention provide methods and systems for capturing images on CMOS color sensors. Merely by way of example, embodiments of the invention have been used to capture true color information on each pixel of an N-type substrate CMOS sensor. But it would be recognized that the invention has a much broader range of applicability.

According to an embodiment, the present invention provides a CMOS image sensing pixel. The pixel includes an n-type substrate, which includes a first width and a first thickness. The pixel also includes a p-type epitaxy layer overlying the n-type substrate. The p-type epitaxy layer includes a second width and a second thickness. The second width is associated with one or more characteristics of a colored light. The pixel additionally includes an n-type layer overlying the p-type epitaxy layer. The n-type layer is associated with a third width and a third thickness. Additionally, the pixel includes a pn junction formed between the p-type epitaxy layer and the n-type layer. Moreover, the pixel includes a control circuit being coupled to the CMOS image sensing pixel.

According to another embodiment, the present invention provides a method for determining color using a CMOS image sensor. The CMOS image sensor includes an n-type substrate and a p-type layer, the p-type layer overlaying the n-type substrate. The method includes a step for applying a first voltage on the n-type substrate. The method also includes a step for obtaining a first output, which is associated with the first voltage. The method additionally includes a step for applying a second voltage on the n-type substrate. Additionally, the method includes a step for obtaining a second output, which is associated with the first voltage. In addition, the method includes a step for applying a third voltage on the n-type substrate. The method additionally includes a step for obtaining a third output, which is associated with the first voltage. The method also includes a step for providing a plurality of weighting factors. The method includes determining a color based on the plurality of weighting factors, the first output, the second output, and the third output.

According to an alternative embodiment, the present invention provides a method for forming a CMOS image sensing pixel, which is configured to determine a color. The method includes a step for providing an n-type substrate that includes a first thickness and a first width. The method also includes a step for forming a p-type layer, the p-type layer overlaying the n-type substrate. The p-type layer includes a second thickness and a second width. The second thickness and the second width are associated with a light characteristic. The method additionally includes a step for forming an n-type layer, the n-type layer overlaying the p-type layer. The n-type layer includes a third thickness and a third width. In addition, the method includes a step for forming a pn junction between the p-type layer and the n-type layer. The pn junction includes a fourth width. The method also includes a step for providing a control circuit. The control circuit is electrically coupled to the n-type substrate.

According to yet another embodiment, the present invention provides an imaging capturing device. The image capturing devices includes a user interface being configured to facilitate an image capturing process. The image capture device also includes a first input being configured to receive a user input. The user input is a command for capturing an image. The image capturing device additionally includes an image sensor being configured to capture an image. Additionally, the image capturing device includes an optical device being positioned to provide a light to form an image on the image sensor. The image capturing device further includes a processor being configured to process images. The image sensor includes an n-type substrate, which includes a first width and a first thickness. The image sensor also includes a p-type layer overlying the n-type substrate. The p-type layer includes a second width and a second thickness. The second width is associated with one or more characteristics of a colored light. The image sensor also includes an n-type layer overlying the p-type layer. The n-type layer is associated with a third width and a third thickness. The image sensor further includes a pn junction formed between the p-type layer and the n-type layer.

It is to be appreciated that the present invention provides various advantages over conventional technologies. For example, compared to color filter techniques, embodiments of the present invention allow costs savings from the color filtering process and minimum circuit design and capture images with true color and pixels. Compared to stacked junction techniques, the present invention is more cost effective and offers better imaging capability. According to an embodiment, only three transistors are needed to implement an image sensing pixel.

Depending upon embodiment, one or more of these benefits may be achieved. These benefits and various additional embodiments, features and advantages of the present invention can be fully appreciated with reference to the detailed description and accompanying drawings that follow.

DETAILED DESCRIPTION OF THE INVENTION

This invention is directed to imaging techniques. More particularly, the invention provides a method and system for capturing images on CMOS color sensors. Merely by way of example, the invention has been used to capture true color information on each pixel of an N-type substrate CMOS sensor. But it would be recognized that the invention has a much broader range of applicability.

As discussed above, various techniques have been developed to provide color separation for CMOS based image sensors. Conventional techniques involved using color filter, stack junction photo diode, and junction separation. However, convention techniques are often inadequate.

Figure 1:
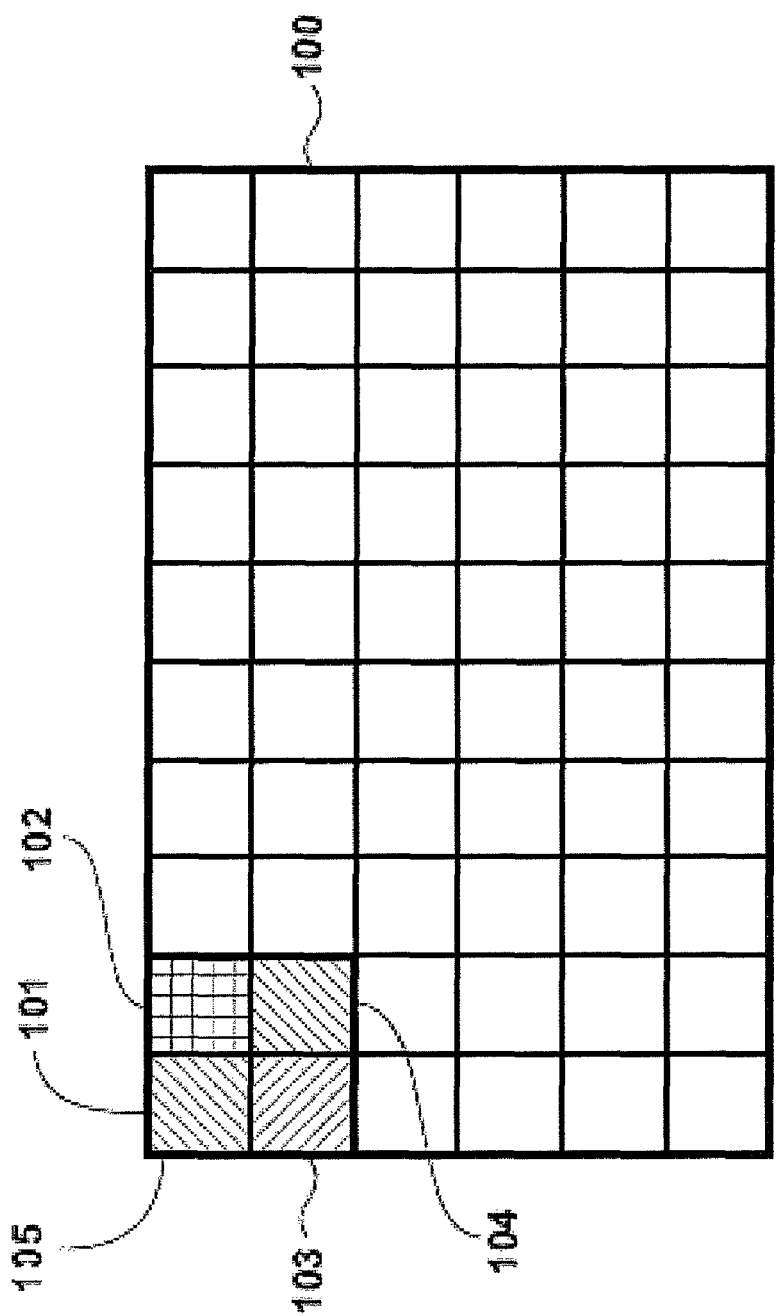
FIG. 1 illustrates a Bayer pattern mask filter used to produce color for an image sensor.

Separating color using color filter has been a popular technique. This technique is based on the concept of additive properties of three primary colors red, green and blue (RGB). When the three primary colors combine, they are capable of producing any other colors. To use color filter technique, a color filter is used to produce colors. FIG. 1 illustrates a Bayer pattern mask filter used to produce color for an image sensor. This diagram is merely an example, which should not unduly limit the scope of the claims. One of ordinary skill in the art would recognize many variations, alternatives, and modifications. The Bayer mask 100 is divided into many pixels to allow light with certain wavelength to pass down to specific pixel. For example, a group 105 of four pixel filters includes three color filters arranged into a square, which includes a red filter 101, a green filter 102, a blue filter 103, and a red filter 104. Each underlying pixel under the color filters essentially captures only the light level associated with that particular color. The final image that is eventually formed is the result of calculation and interpolation of value of the pixel and its surround pixels. For example, the red signal from the pixel underlying the red filter 101 is the average of surrounding green pixels. However, sine the color of each pixel is a result of calculation and interpolation instead of actual color that is directed to the particular pixel, the true color value for that pixel is not obtained. As a result, the color of a captured image may be off, and sometimes the filtering and interpolations produce undesirable artifacts.

Figure 2A:
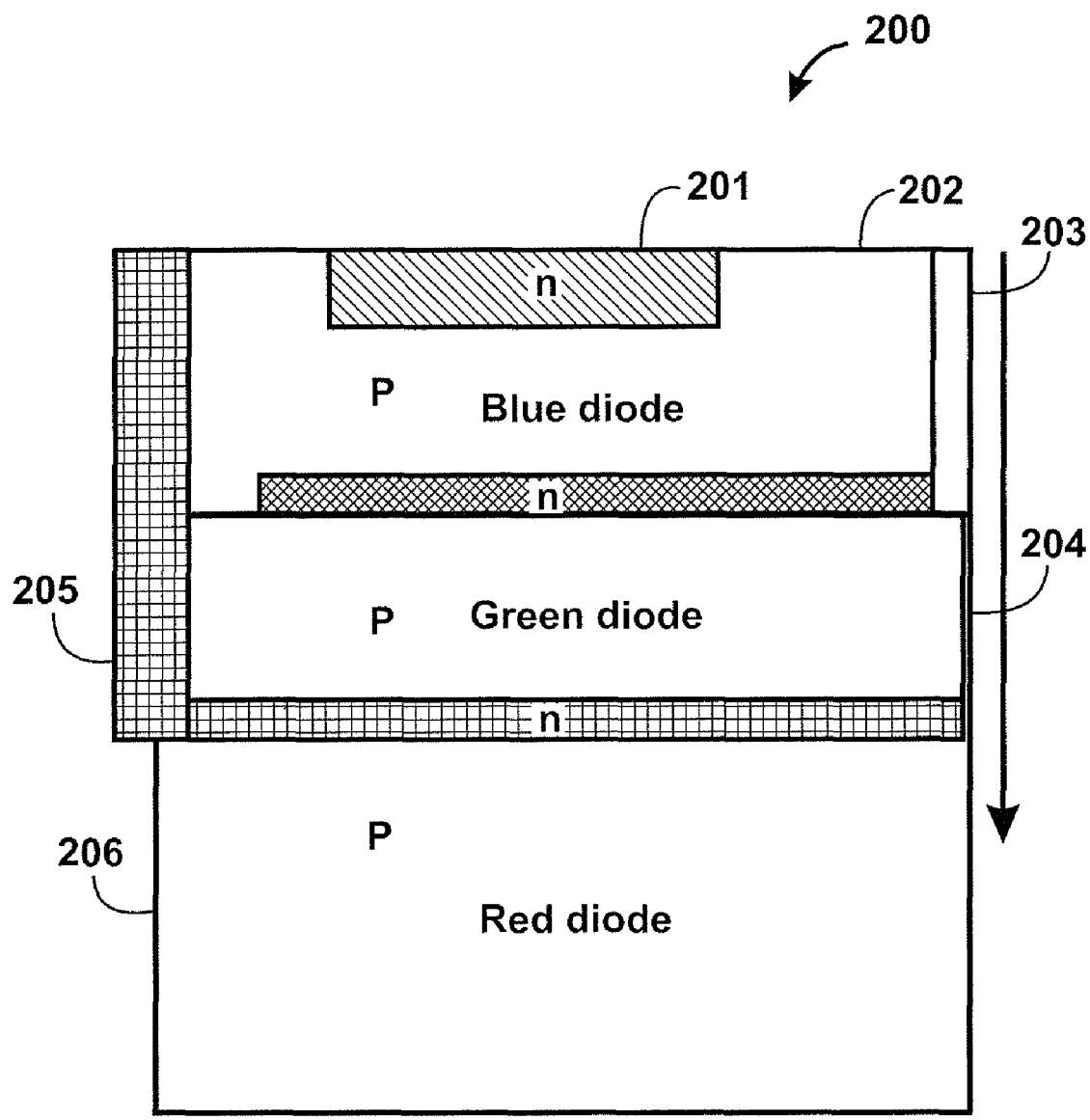
FIG. 2A is a simplified diagram illustrating a conventional image sensor implemented with stack junction technology.

To produce "true" color on each pixel, other color separation techniques have been developed. For example, stack junction technology is sometimes used to provide color separation. FIG. 2A is a simplified diagram illustrating a conventional image sensor implemented with stack junction technology. The stack junction image sensor 200 includes three color layers. A blue diode 202 overlays a green diode 204, which overlays a red diode 206. Each diode is underneath an n-type region so that pn junctions are formed. During an image sensing and color separation process, photon or light passes through the blue diode 202 first, the green diode 204 next, and finally the red diode 206.

The structure of the stack junction image sensor 200 is relatively more complex compared with those of images sensors using color filtering. Consequently, it is often more expensive and difficult to produce stack junction image sensors. For example, the manufacturing of stack junction image sensors requires additionally epitaxy processes to form color layers and additionally structures to make connection and isolation. In addition, stack junction image sensors are often vulnerable to noise due to limited junction capacitance. For example, junction expansion along in silicon junction has little effect in changing the collecting efficiency since the life-time of minority carrier is usually long in silicon.

Figure 2B:
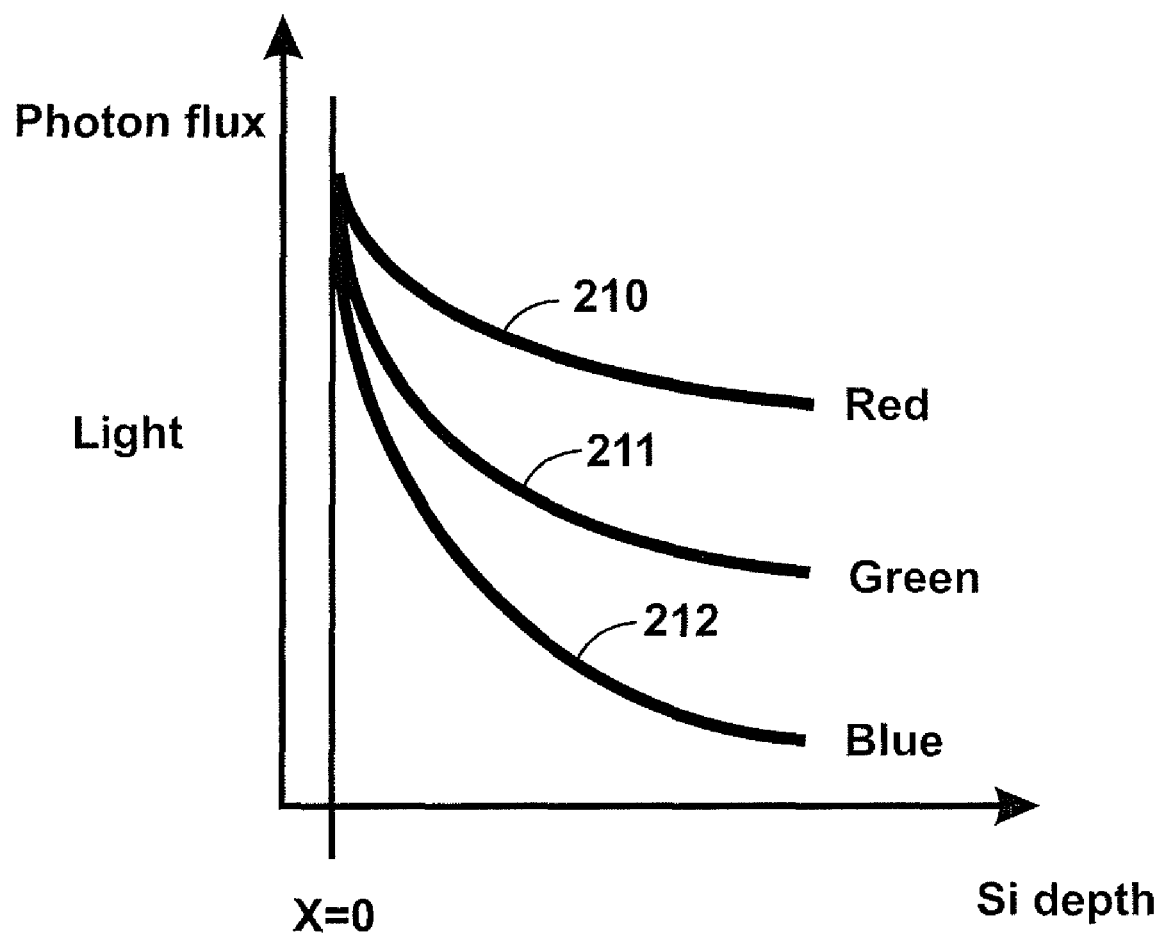
FIG. 2B is a graph illustrating the absorption coefficient associated with color.

The principle of stack junction technology is based on the absorption decays associated with a silicon depth governed by an absorption coefficient. The higher the absorption coefficient, the faster it decays. For example, blue photons are associated with a higher absorption coefficient and therefore decays faster than green and red photons. FIG. 2B is a graph illustrating the absorption coefficient associated with color. This diagram is merely an example, which should not unduly limit the scope of the claims. One of ordinary skill in the art would recognize many variations, alternatives, and modifications. As show in FIG. 2B, the blue photon flux curve 212 drops the most as the silicon depth increases. And since green has an absorption coefficient that is between absorption coefficients of blue and red, the green photon flux curve 211 is between the blue photon flux curve 212 and the red photon flux curve 210.

As analyzed above, conventional techniques for image sensing are often inadequate. Therefore, it is desirable to have an improved color separation scheme.

Figure 3:
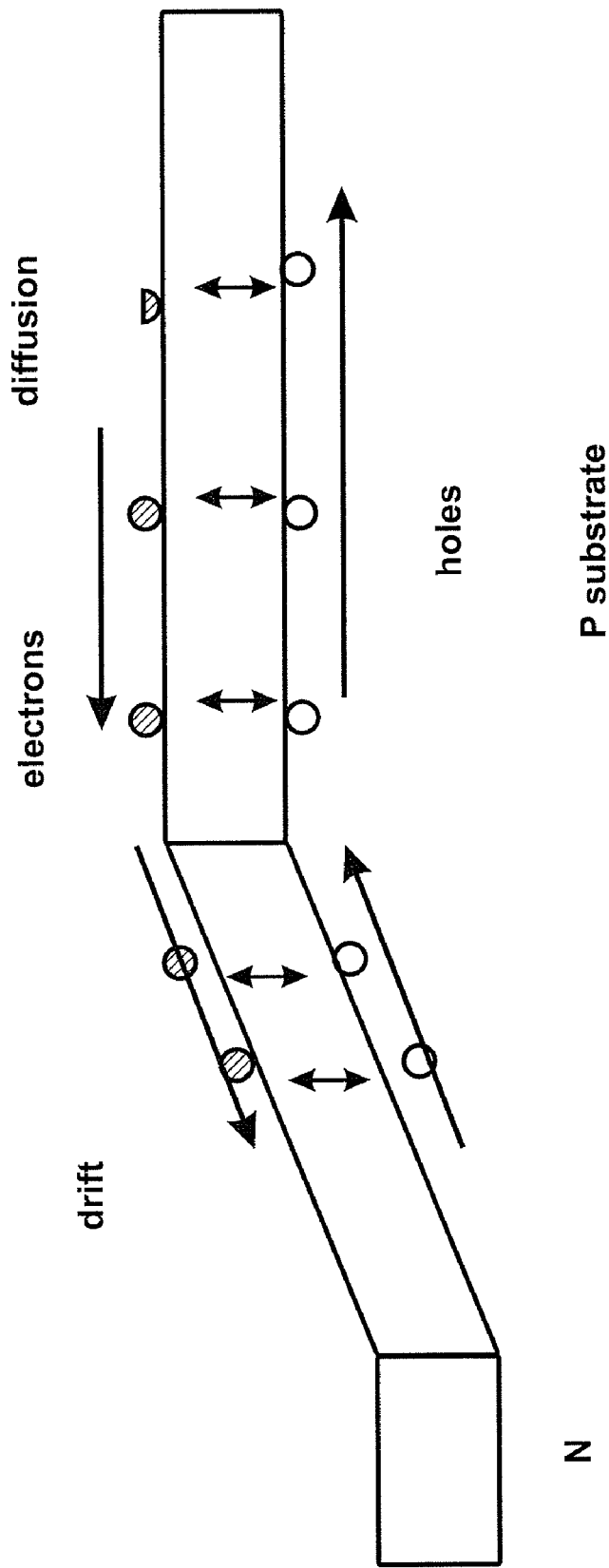
FIG. 3 is a simplified diagram illustrating the diffusion principle utilized in conventional CMOS image sensors.

It is to be appreciated that the present invention utilizes a novel operating principle as compared to conventional technologies. For example, conventional CMOS sensor is implemented with the diffusion principle. FIG. 3 is a simplified diagram illustrating the diffusion principle utilized in conventional CMOS image sensors. A photodiode used in the CMOS image sensor is a np junction diode and electrons are collected by an electric field and by diffusion. However, silicon is usually associated with poor photon absorption characteristics. As a result, most carriers are generated far deeper in the depletion region, especially for the red-color light.

Figure 4:
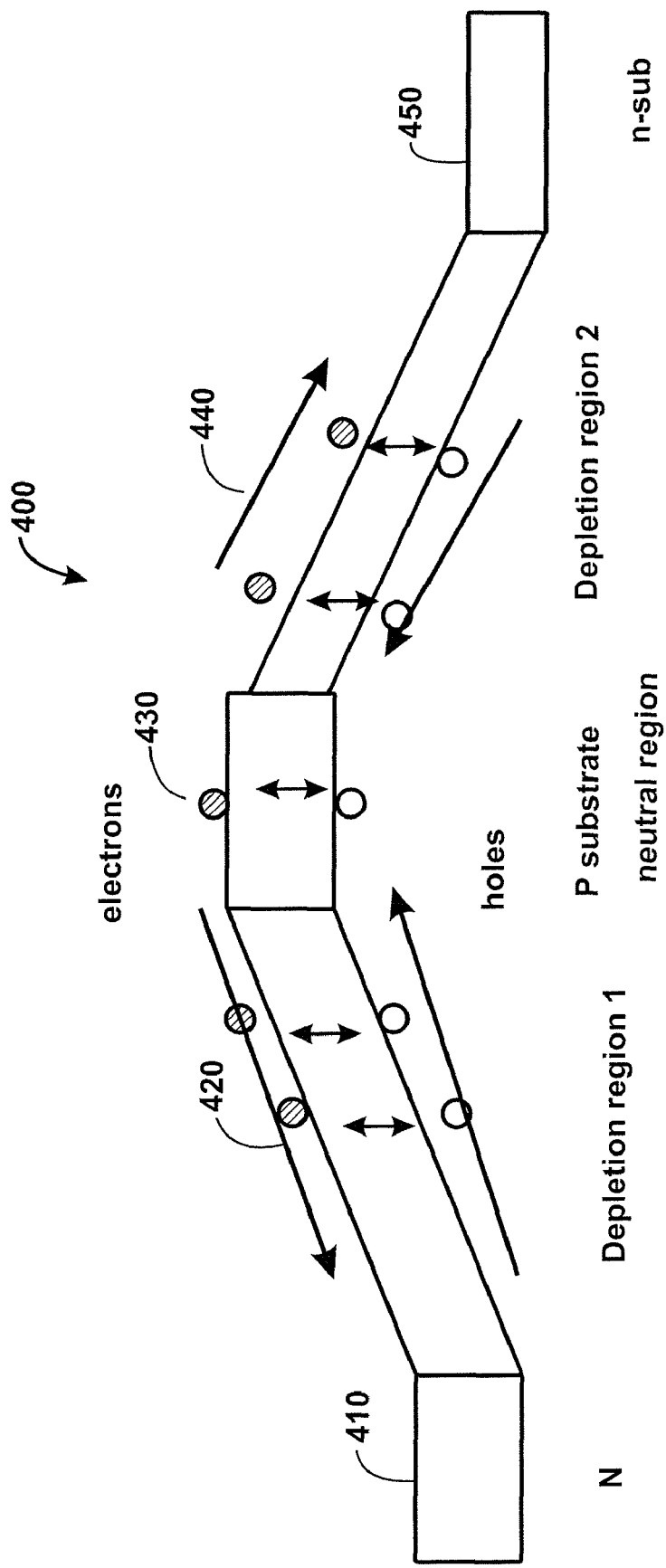
FIG. 4 is a simplified diagram illustrating a working principle of a CMOS image sensor according to an embodiment of the present invention.

In contrast, the present invention operates, among other things, under a different principle. FIG. 4 is a simplified diagram illustrating a working principle of a CMOS image sensor according to an embodiment of the present invention. This diagram is merely an example, which should not unduly limit the scope of the claims. One of ordinary skill in the art would recognize many variations, alternatives, and modifications. According to an embodiment, the present invention utilizes two depletion regions 420 and 440 as illustrated in FIG. 4. An image sensor 400 includes an n-type region 410, a depletion region 420, a p-substrate neutral region 430, a depletion region 440, and an n-type substrate 450. As compared to the conventional techniques, an np junction between the n-type region 410 and the p substrate neutral region 430 is formed. For the image sensor 400 to work properly, the reverse bias of the n-type substrate 450 to the p substrate neutral region 430 can be changed to adjust the width of the depletion region 440. When the n-type substrate 450 is reverse biased, photon-generated carriers beyond the p-substrate neutral region 430 can not be collected by the photodiode in the front, therefore, contribute no extra voltage. By changing the width of the depletion region 440, the quantum efficiency of red or green light can be adjusted, since they are absorbed deeper in the silicon toward the n-type substrate 450.

Figure 5:
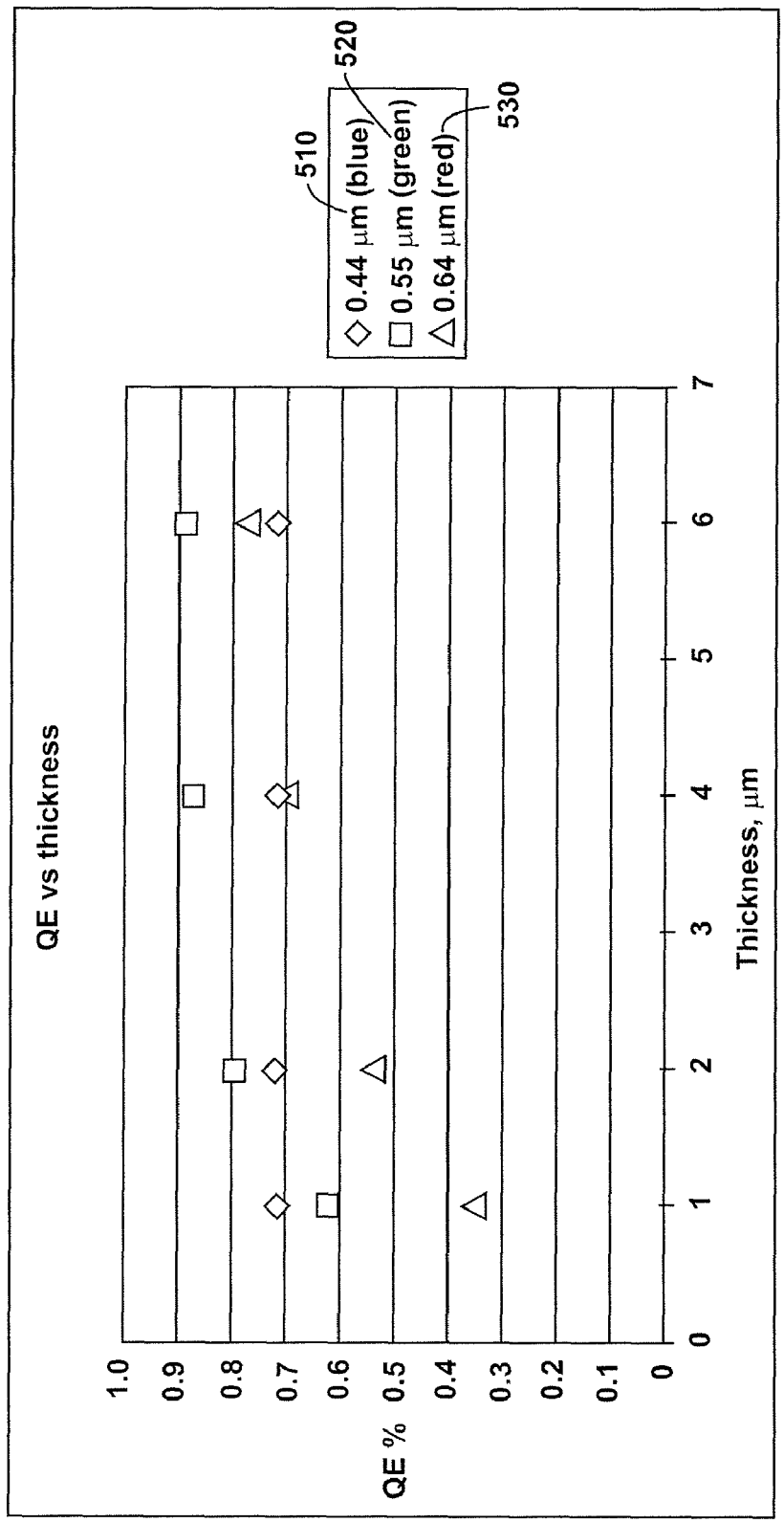
FIG. 5 is a simplified diagram illustrating the relationship between quantum efficiency and thickness according to an embodiment of the present invention.

FIG. 5 is a simplified diagram illustrating the relationship between quantum efficiency and thickness according to an embodiment of the present invention. This diagram is merely an example, which should not unduly limit the scope of the claims. One of ordinary skill in the art would recognize many variations, alternatives, and modifications. As illustrated in FIG. 5, green usually carries the highest quantum efficient, while red generally carries the lowest quantum efficiency. In addition, quantum efficiency is proportional to the thickness. For example, the quantum efficiency increases as the thickness increases.

Figure 6:
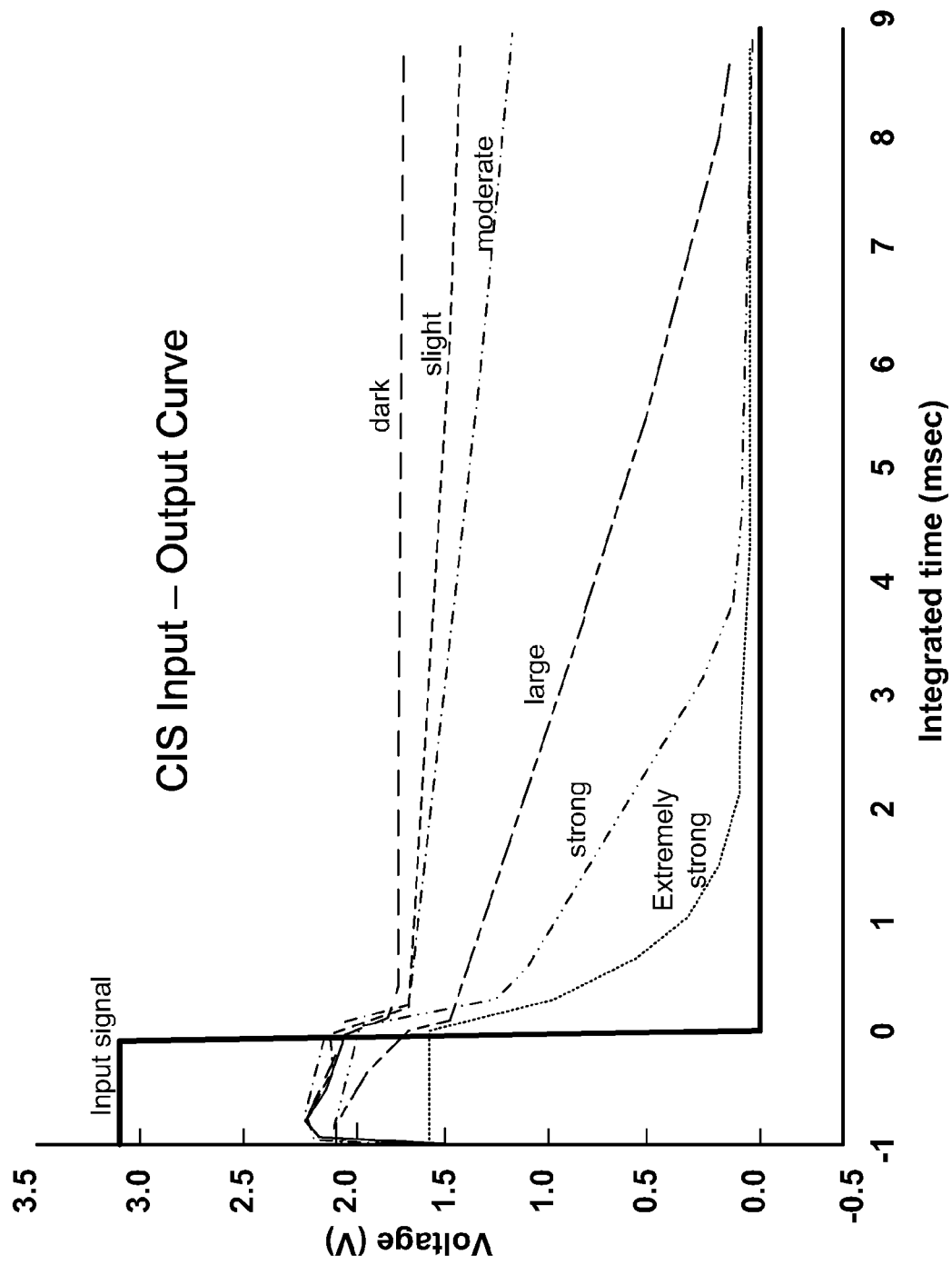
FIG. 6 is a simplified diagram illustrating the relationship between voltage level and integration time according to an embodiment of the present invention.

FIG. 6 is a simplified diagram illustrating the relationship between voltage level and integration time according to an embodiment of the present invention. This diagram is merely an example, which should not unduly limit the scope of the claims. One of ordinary skill in the art would recognize many variations, alternatives, and modifications.

Figure 7:
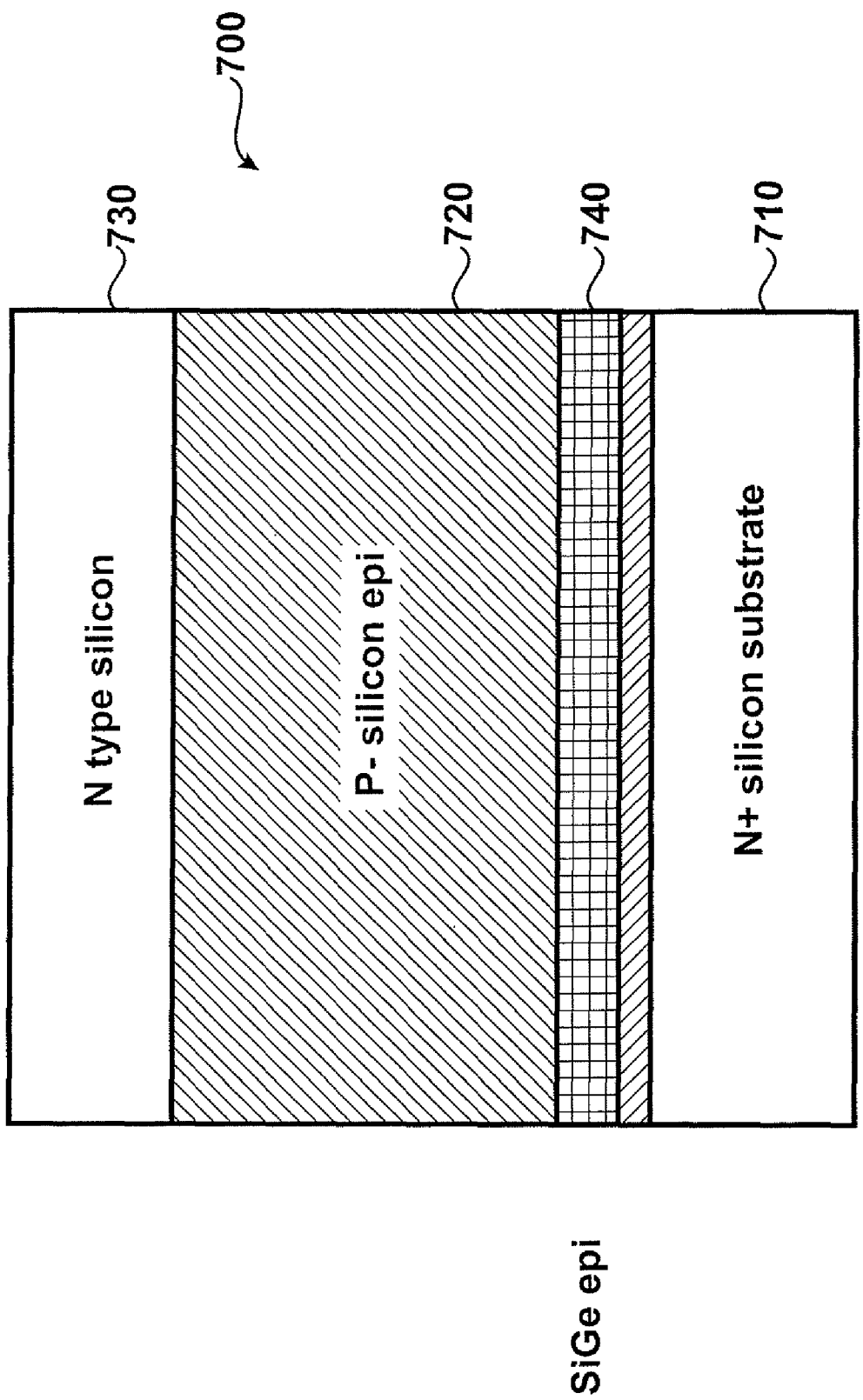
FIG. 7 is a simplified diagram illustrating an image sensor according to an embodiment of the present invention.

FIG. 7 is a simplified diagram illustrating an image sensor 700 according to an embodiment of the present invention. This diagram is merely an example, which should not unduly limit the scope of the claims. One of ordinary skill in the art would recognize many variations, alternatives, and modifications. The image sensor 700 includes an n-type substrate 710 at the bottom. For example, the n-type substrate is made of silicon. On top of the n-type substrate 710 overlays a p-type epitaxy layer 720. According to an embodiment, the p-type epitaxy layer 720 is formed with adjustable doping concentration and thickness. As an example, the p-type epitaxy layer 720 includes a p-type silicon. For example, the p-type epitaxy layer 720 has a thickness ranging from 2 um to 7 um. On top of the p-type epitaxy layer 720 overlays an n-type layer 730 so that a pn junction between the p-type epitaxy layer 720 and the n-type layer 730 is formed. For example, the n-type layer 730 has a thickness of less than 0.5 um. According to some embodiments, an epitaxy layer 740 is formed between the n-type substrate 710 and the p-type epitaxy layer 720. For example, the epitaxy layer 740 consists of silicon germanium material. Depending upon application, the silicon germanium material is used to enhance the red light absorption. For example, because the absorption coefficient of silicon for red light is poor, and sometimes implantation of thick p-type epitaxy device could lead to a high voltage, the silicon germanium material is added to boost photon absorption. As merely an example, a silicon germanium epitaxy layer has a thickness ranging from about 0.1 um to about 1 um depending on the germanium concentration.

According to an embodiment, the present invention applies different bias voltages on the n-type substrate 710 to obtain different color components. Bias voltages are based on the light absorption properties of the RGB color as explained above. According to an embodiment, a high bias voltage is used for a blue light component, medium bias voltage is used for blue and green light components, and zero voltage bias voltage is used for blue, green, and red light components.

An embodiment of the present invention for determining a color using a CMOS image sensor may operate in three biasing steps. The CMOS image sensor includes an n-type substrate and a p-type epitaxy layer overlying the n-type substrate. At the first step, a high biasing voltage is applied to the n-type substrate so that the p-type epitaxy layer 720 region is made short. As a result, the only carriers collected are those generated in the depletion region formed between the p-type epitaxy layer 720 and the n-type layer 730. During the first step, the voltage response obtained from the image sensor is primarily due to the blue light component. The voltage response obtained in the first step may be expressed as follows.

$$\Delta Vresponse = B\Delta Vb + g1\Delta Vg + r1\Delta Vr \quad \text{(Equation 1)}$$

where B is the weighting factor for the blue light component; the term $\Delta Vb$ represents the response due to the blue light component. The term $g1\Delta Vg$ represents the voltage response due to the green light component. The term $r1\Delta Vr$ represents the voltage response due to the red light component.

In the second step, a medium bias voltage that is associated with the green light component is applied to the n-type substrate. The voltage response at the second step may be expressed as follows.

$$\Delta Vresponse = B\Delta Vb + b2\Delta Vb1 + G\Delta Vg + g1\Delta Vg + (r1+r2)\Delta Vr \quad \text{(Equation 2)}$$

where B is the weighting factor for blue color; G is the weighting factor for the green light component; $B\Delta Vb$ represents the response due to the blue light component; $G\Delta Vg$ represents the response due to the green light component; $g1\Delta Vg$ represents the voltage response due to the green light component; $r2\Delta Vr$ represents the voltage response due to the red light component. It is noted that the green light component at the second step contributes a major portion to the voltage response.

In the third step, a low bias voltage that is associated with the red light component is applied to the n-type substrate. In an embodiment, the low bias voltage for the red light component is zero volt. The voltage response obtained in the third step may be expressed according to the following equation.

$$\Delta Vresponse = B\Delta Vb + b3\Delta Vb1 + G\Delta Vg + (g1+g3)\Delta Vg + (r1+r2)\Delta Vr + R\Delta Vr \quad \text{(Equation 3)}$$

where B is the weighting factor for the blue light component, G is the weighting factor for the green light component, R is the weighting factor for the red light component; $B\Delta Vb$ represents the response due to the blue light component; $\Delta Vg$ represents the response due to the green light component; $R\Delta Vr$ represents the response due to the red light component; (g1+g3) represents the voltage response due to green color. The term $r2\Delta Vr$ represents the voltage response due to the red light component. It is noted that the red light component in the third step contributes a major portion to the voltage response.

Figure 8:
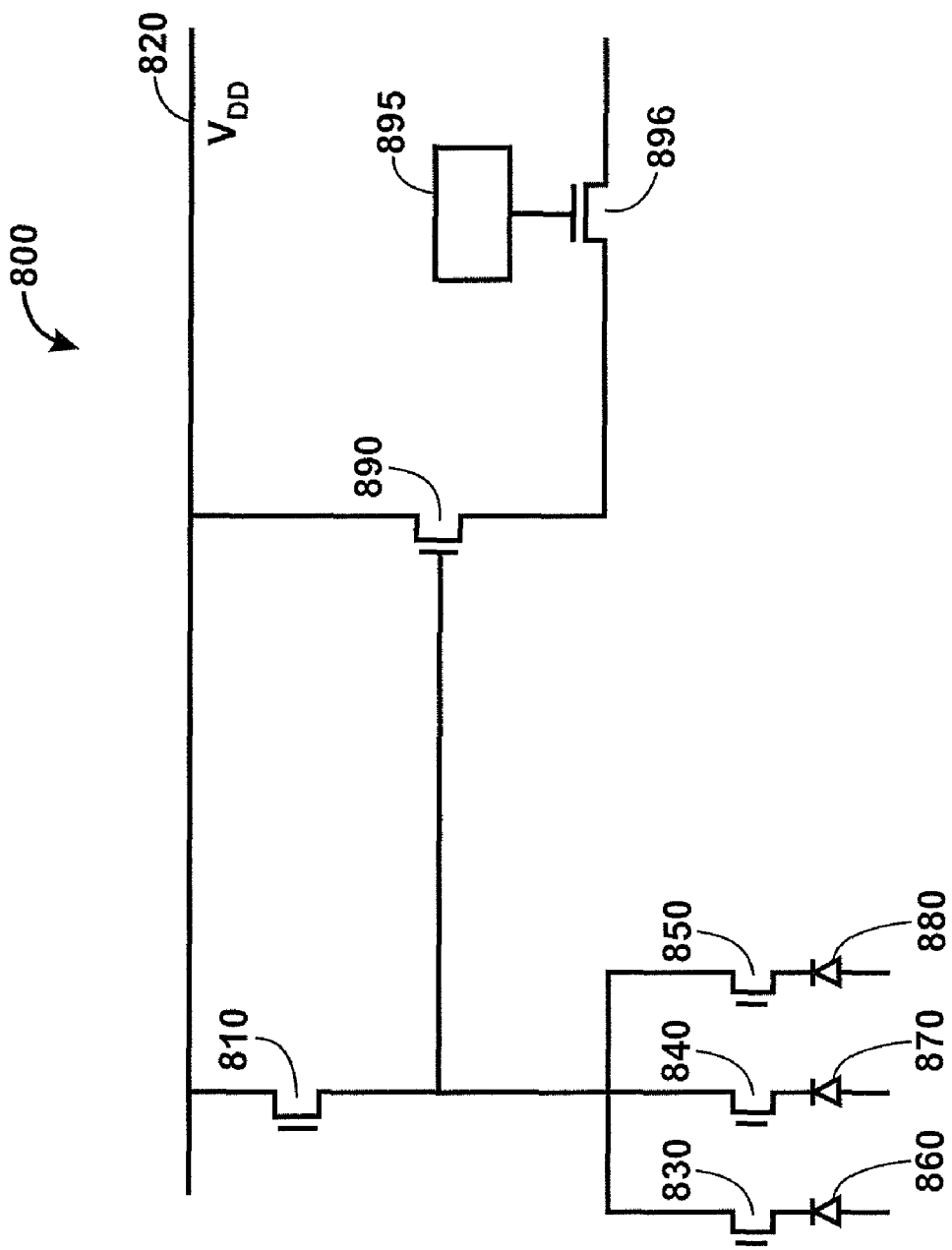
FIG. 8 is a simplified diagram illustrating an image sensor circuit according to an embodiment of the present invention.

In an embodiment, by adjusting the reset voltage, the p-type epitaxial layer doping, and the reverse bias of the n-type substrate, the weighting factors B, G, R can be made much larger then the parameters bi, g1, and ri (I=1, 2, and 3) and calibrated for specific image sensors. According to some embodiments, the present invention provides color separation schemes with fixed photodiode depletion, which could simplify the circuit design and process. FIG. 8 is a simplified diagram illustrating an image sensor circuit according to an embodiment of the present invention. This diagram is merely an example, which should not unduly limit the scope of the claims. One of ordinary skill in the art would recognize many variations, alternatives, and modifications. As illustrated according to FIG. 8, three transistors 830, 840, and 850 are used for blue, green, and red color based on voltage.

Figure 9:
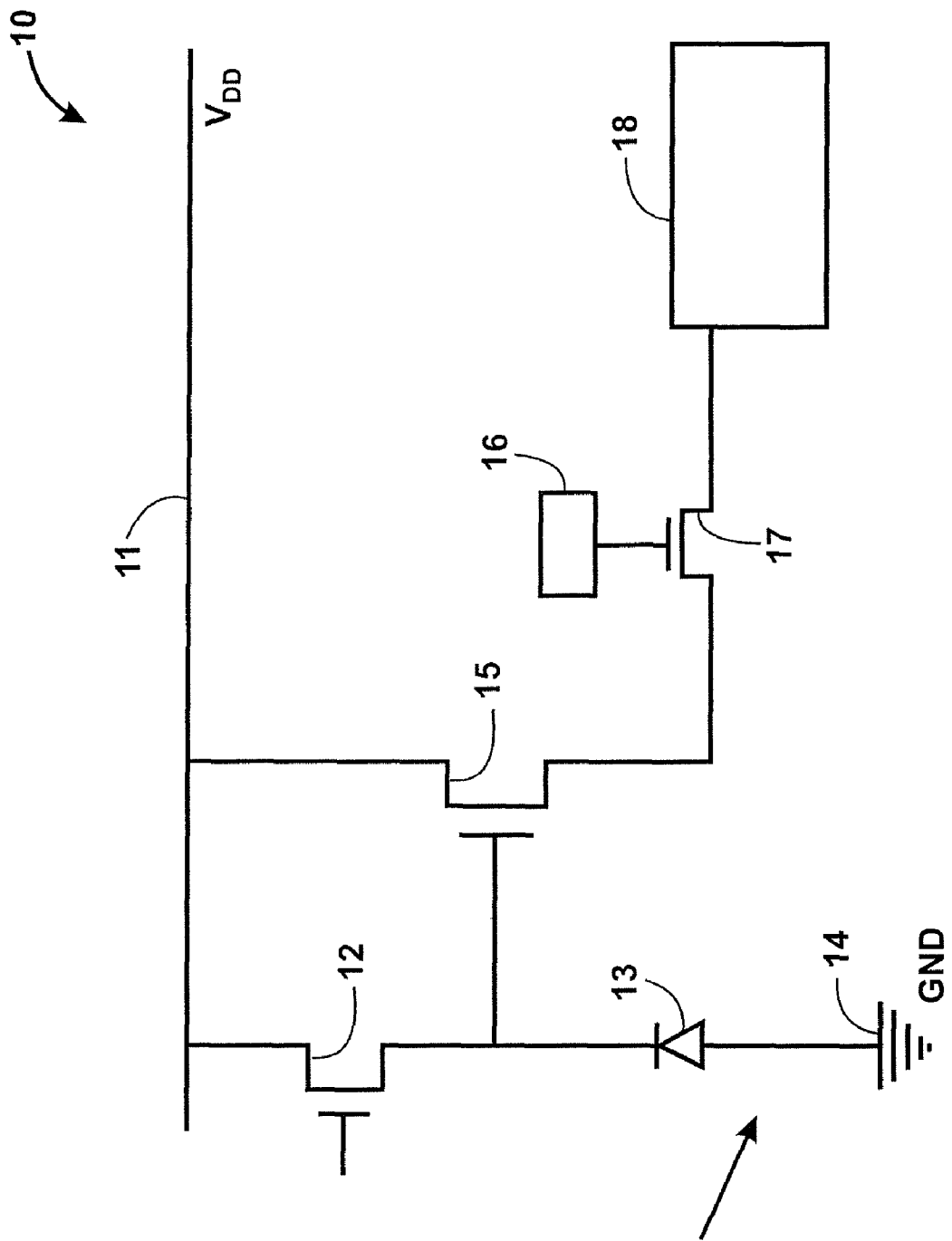
FIG. 9 is a simplified diagram illustrating an image sensor circuit according to an embodiment of the present invention.
Figure 10:
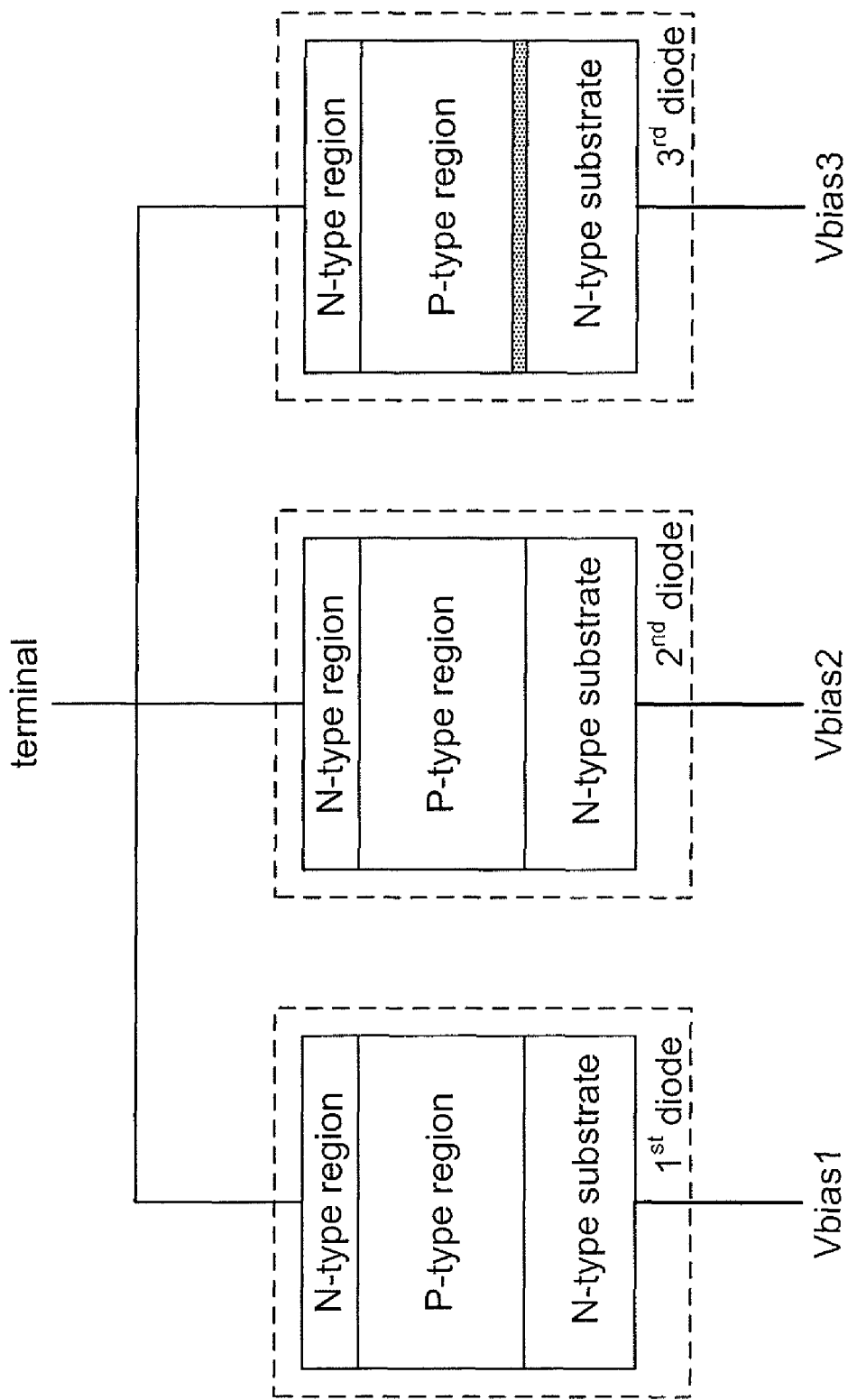
FIG. 10 is a simplified diagram illustrating an image sensing pixel device having a first photodiode, a second photodiode, and a third photodiode according to an embodiment of the present invention.

FIG. 9 is a simplified diagram illustrating an image sensor circuit 10 according to an embodiment of the present invention. This diagram is merely an example, which should not unduly limit the scope of the claims. One of ordinary skill in the art would recognize many variations, alternatives, and modifications. The CMOS sensor unit 10 includes a photo detector 13, a reset transistor 12, a source follower transistor 15, a row select transistor 17 that is turned on and off by a select signal 16, and a CMOS circuit 18. As merely an example, the transistors in the CMOS sensor unit 10 control the on and off states to read a light signal at a appropriate time. According to an embodiment, a typical operation involves three steps, each step is designed to capture a major part of an individual light component: blue, green, or red. The back side is a reverse biased pn junction. When doing blue light absorption, a high bias voltage is used, so that red and green photons will not be collected. When doing green light absorption, a medium bias is used and green photons will be added to the response. Finally, the back side bias voltage is removed to collect the blue, green, and red light absorption. As merely an example, the back side bias voltage can be synchronized with the main circuit signal process timing.

According to an embodiment, the present invention provides a CMOS image sensing pixel. The pixel includes an n-type substrate, which includes a first width and a first thickness. The pixel also includes a p-type epitaxy layer overlying the n-type substrate. The p-type epitaxy layer includes a second width and a second thickness. The second width is associated with one or more characteristics of a colored light. The pixel additionally includes an n-type layer overlying the p-type epitaxy layer. The n-type layer is associated with a third width and a third thickness. Additionally, the pixel includes a pn junction formed between the p-type epitaxy layer and the n-type layer. Moreover, the pixel includes a control circuit being coupled to the CMOS image sensing pixel.

According to another embodiment, the present invention provides a method for determining color using a CMOS image sensor. The CMOS image sensor includes an n-type substrate and a p-type layer, the p-type layer overlaying the n-type substrate. The method includes a step for applying a first voltage on the n-type substrate. The method also includes a step for obtaining a first output, which is associated with the first voltage. The method additionally includes a step for applying a second voltage on the n-type substrate. Additionally, the method includes a step for obtaining a second output, which is associated with the first voltage. In addition, the method includes a step for applying a third voltage on the n-type substrate. The method additionally includes a step for obtaining a third output, which is associated with the first voltage. The method also includes a step for providing a plurality of weighting factors. The method includes determining a color based on the plurality of weighting factors, the first output, the second output, and the third output. For example, the embodiment is illustrated according to FIG. 7.

According to an alternative embodiment, the present invention provides a method for forming a CMOS image sensing pixel, which is configured for determining a color. The method includes a step for providing an n-type substrate that includes a first thickness and a first width. The method also includes a step for forming a p-type layer, the p-type layer overlaying the n-type substrate. The p-type layer includes a second thickness and a second width. The second thickness and the second width are associated with a light characteristic. The method additionally includes a step for forming an n-type layer, the n-type layer overlaying the p-type layer. The n-type layer includes a third thickness and a third width. In addition, the method includes a step for forming a pn junction between the p-type layer and the n-type layer. The pn junction includes a fourth width. The method also includes a step for providing a control circuit. The control circuit is electrically coupled to the n-type substrate. For example, the embodiment is illustrated in FIG. 7.

According to yet another embodiment, the present invention provides an imaging capturing device. The image capturing devices includes a user interface being configured to facilitate an image capturing process. The image capture device also includes a first input being configured to receive a user input. The user input is a command for capturing an image. The image capturing device additionally includes an image sensor being configured to capture an image. Additionally, the image capturing device includes an optical device being positioned to provide a light to form an image on the image sensor. The image capturing device further includes a processor being configured to process images. The image sensor includes an n-type substrate, which includes a first width and a first thickness. The image sensor also includes a p-type layer overlaying the n-type substrate. The p-type layer includes a second width and a second thickness. The second width is associated with one or more characteristics of a colored light. The image sensor also includes an n-type layer overlaying the p-type layer. The n-type layer is associated with a third width and a third thickness. The image sensor further includes an pn junction formed between the p-type layer and the n-type layer. For example, the embodiment is illustrated according to FIG. 7.

It is to be appreciated that the present invention provides an improvement over the color filtering technique and stack junction technique. For example, integrating color separation capability into one pixel has greater advantage over using several pixels with color filter. Capturing true color with each individual pixel provides better color resolution and better image quality. Stack junction technique thus provide better image quality than image sensing pixels using color filters. However, the stack junction technique consumes more area and has a higher manufacturing cost. Typically, the stack junction technique requires three additional transistors to individually control the photodiodes for blue, green, and red. The required additional control transistors limit the pixel size reduction comparing with the conventional three-transistor design. For example, the connection plugs and contacts for green and red photodiodes occupy valuable pixel area. As a result, a color sensing pixel becomes difficult to shrink beyond a certain size. Moreover, the extra two epitaxy layers also add cost and lower yield and uniformity during the manufacturing process. More transistors make the circuitry even more difficult to design and process.

Embodiments of the present invention provide a better color separation capability and lower noise level in the image capturing process. Often, the color separation capability is intrinsic characteristic associated with long diffusion length. Generally, diode quantum efficiency has very little dependency on the depletion width.

Noise is often associated with junction capacitance. For example, junction capacitance is inversely related to the reverse bias voltage. Capacitance and reverse bias voltage are related as follows:

$$V = 1/C^2 \quad \text{(Equation 4)}$$

Equation 4 indicates that small capacitance leads to large $\Delta V$ since $\Delta V = \Delta Q/C$. Even with fixed noise level $\Delta Q$, $\Delta V$ will be larger. Typically $\Delta Q$ increases as the reverse bias voltage increases.

Embodiments of the present invention provide improved and better solutions in terms of color separation capability and lower noise level. The reversed biased depletion region between the n-type substrate and the p-type layer acts as a valve that controls the photon generated carriers flowing into the active pixel region. For example, embodiments of the present invention allow changing the photodiode quantum efficiency significantly by shrinking or expanding the width of the p-type layer. According to various embodiments, the present invention does not require adjusting bias voltage of the active pixel or the capacitance change. As a result, noise level can be kept constant.

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A method for determining a color using a CMOS image sensor, wherein the CMOS image sensor includes an n-type silicon substrate and a p-type epitaxy layer, the p-type epitaxy layer overlaying the n-type substrate, the method comprising:
    applying a first voltage on the n-type substrate;
    obtaining a first output, the first output being associated with the first voltage;
    applying a second voltage on the n-type substrate;
    obtaining a second output, the second output being associated with the second voltage;
    applying a third voltage on the n-type substrate;
    obtaining a third output, the third output being associated with the third voltage;
    providing a plurality of weighting factors; and
    determining the color based on the plurality of weighting factors, the first output, the second output, and the third output.

2. The method of claim 1, wherein the first output is associated with a first color.

3. The method of claim 2 wherein the first color is a blue color.

4. The method of claim 1, wherein the plurality of weighting factors includes:
    a first weighting factor, the first weighting factor being associated with a blue color;
    a second weighting factor, the second weighting factor being associated with a green color; and
    a third weighting factor, the third weighting factor being associated with a red color.

5. The method of claim 1, wherein the color comprises:
    a first component;
    a second component; and
    a third component.

6. The method of claim 5, wherein the determining the color comprises:
    determining the first component based on the first output;
    determining the second component based on the second output and the first component; and
    determining the third component based on the third output, the first component, and the second component.

7. The method of claim 5, wherein:
    the first component is a blue color component;
    the second component is a green color component; and
    the third component is a red color component.

8. The method of claim 1, wherein:
the first voltage is higher than the second voltage;
the second voltage is higher than the third voltage.

9. The method of claim 8, wherein the third voltage is zero volt.

10. The method of claim 1, wherein:
the first output is associated with a blue color;
the second output is associated with the blue color and a green color; and
the third output is associated with the blue color, the green color, and a red color.

* * * * *